United States Patent
Versen et al.

(10) Patent No.: US 7,120,070 B2
(45) Date of Patent: Oct. 10, 2006

(54) METHOD FOR TESTING THE SERVICEABILITY OF BIT LINES IN A DRAM MEMORY DEVICE

(75) Inventors: Martin Versen, Munich (DE); Klaus Nierle, Essex Junction, VT (US)

(73) Assignee: Infineon Technologies AG, Munich (DE)

( * ) Notice: Subject to any disclaimer, the term of this patent is extended or adjusted under 35 U.S.C. 154(b) by 34 days.

(21) Appl. No.: 10/930,132

(22) Filed: Aug. 31, 2004

(65) Prior Publication Data
US 2006/0048022 A1    Mar. 2, 2006

(51) Int. Cl.
G11C 7/00 (2006.01)

(52) U.S. Cl. .................. 365/201; 365/226; 365/227; 365/205; 365/204

(58) Field of Classification Search ............. 365/201, 365/226, 227, 205, 204
See application file for complete search history.

(56) References Cited

U.S. PATENT DOCUMENTS

| | | | | |
|---|---|---|---|---|
| 5,999,480 | A * | 12/1999 | Ong et al. | 365/230.06 |
| 6,327,200 | B1 * | 12/2001 | Casper | 365/201 |
| 6,333,879 | B1 * | 12/2001 | Kato et al. | 365/201 |
| 6,574,159 | B1 * | 6/2003 | Ohbayashi et al. | 365/201 |
| 6,628,162 | B1 * | 9/2003 | Kondo et al. | 327/540 |
| 6,643,218 | B1 * | 11/2003 | Chun | 365/233 |

* cited by examiner

Primary Examiner—Viet Q. Nguyen
(74) Attorney, Agent, or Firm—Jenkins, Wilson, Taylor & Hunt, P.A.

(57) ABSTRACT

DRAM memory device (1) comprising at least one array of memory cells (2, 3, 4, 5), each memory cell (12) being connected to a bit line (BL) and a word line (WL), each of said bit lines (BL) being connected to a sense amplifier and a pre-charge circuit (15); a controllable active-current generator (7, 8, 9, 10) for providing power to the sense amplifiers and pre-charge circuits (15) for a time interval that is limited by a time at which a command for a read or write access is applied to the DRAM memory device (1) and an assigned switching time; a controllable standby-current generator (6) for providing power to the sense amplifiers and pre-charge circuits (15) after the switching time; a control circuit (11) for receiving external data, address and control signals (C, A, D) and for controlling the active-current generator (7, 8, 9, 10) and the standby-current generator (6); wherein the control circuit (11) is adapted to control the time for switching the respective power generator (6, 7, 8, 9, 10) to the sense amplifiers and to the pre-charge circuits (15) subject to an external test mode signal for reducing the overall testing time in a test of the serviceability of the bit lines (BL), sense amplifiers and pre-charge circuits (15).

12 Claims, 4 Drawing Sheets

METHOD FOR TESTING THE SERVICEABILITY OF BIT LINES IN A DRAM MEMORY DEVICE

TECHNICAL FIELD

The current invention relates to a method for testing the serviceability of bit lines, sense amplifiers and pre-charge circuits in a DRAM memory device.

BACKGROUND ART

Random access memories are usually used as the main computer memory to store instructions and data for fast access by the processing units. In those random access devices, the storage elements are organized in a matrix, sometimes also quoted memory cell array, that facilitates short access times which are independent on the location of the data. A memory cell array is made up of a plurality of bit lines and a plurality of crossing word lines. At the crossing points memory cells are located for the actual storage of the binary states 0 and 1 reflected by logic low and high voltage potentials.

RAM devices are classified into volatile and nonvolatile RAM. The volatile RAM comprises static RAM (SRAM) and employs FLIP-FLOP-based latches as storage elements or memory cells, while the so-called dynamic RAM (DRAM) uses a tiny capacitor with two different charge state levels to represent binary information.

FIG. 1 shows an exemplary DRAM memory chip according to prior art. The memory chip M comprises a memory cell array MCA, a row address decoder RAD, a column address decoder CAD, a control CT, an active-current generator AG and a standby-current generator ST. The memory cell array MCA comprises a plurality of bit lines BL and a plurality of word lines WL of which only one of each is shown as an example. At the crossing points of the word and bit lines, a memory cell MC is situated which comprises an access transistor T and a storage capacitor CS. The access or select transistor T is implemented as a switch controlled by a signal on the word line and connects the storage capacitor CS between the respective bit line BL and a reference potential GND which is chosen as ground, here.

The row address decoder RAD is connected to the word lines for selecting the word lines and has for each word line a respective word line driver WLD. The column address decoder CAD is connected to the bit lines and has a sense amplifier and pre-charge circuit SA for each bit line for reading and writing data from and into the memory cells.

The active-current generator AG or the standby-current generator SG serves as a power supply for the sense amplifiers and pre-charge circuits SA. The control CT is connected by a plurality of lines to a control input IC and an address input IA and a data in- and output BD of the DRAM memory chip M for receiving respective control, address and data signals C, A, D. The control CT sends row address signals RA to the row address decoder RAD and column address signals CA and data signals D to the column address decoder CAD. Further, the control CT is adapted to control the active-current generator AG by a respective power control signal PC.

The active-current generator AG is capable of providing relatively high power to the sense amplifiers and pre-charge circuits SA when a read or write operation is initiated. After a predetermined time period, the active-current generator AG sends a timing signal TS to the standby-current generator SG for taking over the power supply to the sense amplifiers and pre-charge circuits SA. The standby-current generator SG provides a relatively low, but sufficient power to the sense amplifiers and pre-charge circuits SA when no read or write process is active in the memory chip M.

A simplified timing scheme of the switching between the active-current and the standby-current generators AG, SG and the voltage characteristics during an exemplary read process from a memory cell MC on a bit line BL. The upper curve shows the time evolution of the voltage $V_{BL}$, $V_{BLB}$ on a bit line BL with respect to ground, and the lower curve shows the respective time evolution of a voltage at a complementary bit line BLB. The voltages are normalized with respect to the nominal voltage $V_{BLH}$ corresponding to a logic high. In modern memory chips $V_{BLH}$ is for instance 1.8 volts.

At the time $t_0$, a read command, address and control signals are applied to the memory chip inputs IC, IA, BD and brings the chip into an active state. This means, the active-current generator AG is switched on through a respective power control signal PC by the control CT. Usually, a short-delay time $t_1$ passes until the respective word line driver WLD selects a word line and the select transistor T provides connectivity between the storage capacitor CS and the selected bit line BL. During a time interval $t_2$-$t_1$, the charge stored in the storage capacitor CS is distributed between the inherent capacitance of the bit line and the storage capacitor.

Between the times $t_2$ and $t_3$, a respective sense amplifier amplifies the changing voltage generated by the additional charge on the bit line and brings it to the nominal value $V_{BLH}$. The analog process occurs for a complementary bit line, wherein in case of a written 1 or logic high in the corresponding complementary memory cell, the voltage on the complementary bit line drops through the redistribution of stored charge in the corresponding storage capacitor and is amplified to 0-level. The voltages on the bit line BL and complementary bit line BLB then represent a logic high.

In memory chips M according to the prior art, the active-current generator AG switches itself off after an elapsed time $t_4$ after activation and contemporaneously switches the standby-current generator SG on for providing power to the sense amplifiers and pre-charge circuits. The time $t_4$ is usually in the order of a hundred nanoseconds after activation. The power supply of the sense amplifiers and pre-charge circuits can be switched to the low power standby-current generator, because power is in particular consumed during the amplification phase between $t_1$ and $t_3$. When the active power generators are switched off after $t_4$—mainly due to leakage between neighboring bit lines or other acceptable defects—the voltage at the bit line decreases until a pre-charge operation is executed. During a pre-charge, the respective word line is deselected, i. e. the select transistor de-couples the storage capacitor from the bit line such that the current voltage at $t_5$ or the corresponding charge in the storage capacitor CS is stored in the memory cell. Contemporaneously, the voltage at the bit line is pre-charged to exactly one half of the nominal bit line high voltage $V_{BLH}$. This time $t_5$ is set to about 80 microseconds complying to industry standards for DRAM memories.

Before delivering memory chips to customers, tests of their proper functioning have to be performed. It is in particular important to test the serviceability of all the bit lines and their respective sense amplifiers and pre-charge circuits. This is usually done by writing a state into the memory cell and waiting a significant time after the active-current generator is switched off. Then, at a time $t_5$ a pre-charge is executed and then the written data into the respective memory cell is read out and compared to the test data. If the bit line sense amplifier and pre-charge circuit works properly, both data, the test data and read-out data are the same. However, should there occur any significant and undesired leakage between bit lines or sense amplifiers are defective, the written test data and read-out data differ from each other.

However, this method of testing the serviceability of the bit line infrastructure in a memory chip according to the prior art has a major disadvantage: for every bit line to be tested, a minimum amount of time of $t_4$ has to be invested until the decrease of the voltage on a bit line can be detected in a test by repeated read-outs of the test data. Since such lengthy chip testing deteriorates the throughput of a DRAM memory device production, faster test methodes are desired.

SUMMARY OF THE INVENTION

It is therefore an object of the present invention to provide a very fast method for testing the serviceability of bit lines, sense amplifiers and pre-charge circuits in a DRAM memory device thereby increasing throughput of tested memory chips in a production.

It is further an object of the invention to provide a DRAM memory device being capable of executing a fast test of the serviceability of its bit lines, sense amplifiers and pre-charge circuits.

An object of the invention is met by a method having the steps according to claim 1.

Accordingly a method for testing the serviceability of bit line sense amplifiers and pre-charge circuits in DRAM memory device comprising the following steps is provided:

(a) setting a DRAM memory device in a test mode;

(b) applying a write command to the DRAM memory device for writing a predetermined test data to a memory cell connected to a bit line and contemporaneously switching on an active-current generator for providing power to a sense amplifier and pre-charge circuit associated to the bit line;

(c) switching off the active-current generator and switching a standby-current generator to the sense amplifier and the pre-charge circuit of the bit line at a controllable switching time, wherein the switching time is earlier with respect to a switching time in a normal operation mode;

(d) performing a pre-charge operation on the bit line by closing a word line associated to the memory cell and applying a pre-charge voltage to the bit line by the associated pre-charge circuit;

(e) reading the data stored in the memory cell;

(f) comparing the read data with the predetermined test data.

It is an advantage of the inventive step method that the switching between the active-current generator and the standby-current generator for supplying power to the sense amplifiers and pre-charge circuits is controllable and chosen shorter than the nominal time $t_4$ as in prior art.

Preferably, the steps are performed for every bit line in the DRAM memory device. Hence, the entire memory chip or device can efficiently be tested without a lot of delay time due to the fixed switchings time as in prior art.

According to one aspect of the invention, the switching time for switching from the active-current generator to the standby-current generator is set to switch before a voltage at the bit line has reached a nominal logic high voltage due to amplification by the sense amplifier. In this variety of the inventive method, the standby-current generator is used to provide power to the sense amplifiers even during the process of amplifying the initially small voltage difference between one half and the actual voltage on the bit line due to the charge redistribution or the additional charge from the storage capacitor on the bit line with respect to the nominal bit line high voltage.

According to another aspect of the invention, the switching time for switching from the active-current generator to the standby-current generator is set to switch after a voltage at the bit line has reached a nominal logic high voltage due to amplification by the sense amplifier.

In a further development of the inventive method, a method for calibrating the time scales for a test of the serviceability of bit lines, sense amplifiers and pre-charge circuits in a DRAM memory device is provided comprising the following steps:

(a) setting a faultless DRAM memory device in a test mode;

(b) applying a write command to the DRAM memory device for writing a predetermined test data to a memory cell connected to a bit line and contemporaneously switching on an active-current generator for providing power to a sense amplifier and pre-charge circuit associated to the bit line;

(c) switching off the active-current generator and switching a standby-current generator to the sense amplifier and the pre-charge circuit of the bit line at a controllable switching time, wherein the switching time is earlier with respect to a switching time in a normal operation mode;

(d) continuously measuring the voltage at the bit line and comparing the measured voltage with a reference voltage and contemporaneously measuring the elapsed time;

(e) storing the elapsed time if the measured voltage falls below the reference voltage for determining a minimum switching time.

The idea is that if a well-functioning DRAM memory device is available one can determine at what voltage on the bit lines the logic states can still be identified after a pre-charge operation, i. e. after a decreasing voltage on the bit line when the active-current generator is switched off, a voltage, or time respectively, can be determined below which the corresponding voltage written into the memory cell in a pre-charge operation is no longer reliable. If the respective time is known from the calibration method, one can chose the appropriate time for the read and pre-charge operation in the actual test method and hence optimize the testing time to a minimum.

The inventive DRAM memory device comprises:

(a) at least one array of memory cells, each memory cell being connected to a bit line and a word line, each of said bit lines being connected to a sense amplifier and a pre-charge circuit;

(b) a controllable active-current generator for providing power to the sense amplifiers and pre-charge circuits for a time interval that is limited by a time at which a command for a read or write access is applied to the DRAM memory device and an assigned switching time;

(c) a controllable standby-current generator for providing power to the sense amplifiers and pre-charge circuits after the switching time;

(d) a control circuit for receiving external data, address and control signals and for controlling the active-current generator and the standby-current generator; wherein the control circuit is adapted to control the time for switching the respective power generator to the sense amplifiers and to the pre-charge circuits subject to an external test mode signal for reducing the overall testing time in a test of the serviceability of the bit lines, sense amplifiers and pre-charge circuits.

It is a major advantage of the inventive DRAM memory device that the switching time can be controlled individually by the control circuit during a test mode. Therefore, no fixed time delay between switching on and off of the active-current generators needs to be incorporated in the test drives.

Hence, preferably the switching time is fixed in a normal operation mode of the DRAM memory device, and the control circuit is adapted to decrease the time interval in a test mode of the DRAM memory device.

In a favorable implementation, the DRAM memory device is additionally provided with a column address decoder connected to the sense amplifiers and pre-charge circuits for reading and writing data from and into the memory cells; a row address decoder connected to the word lines for selecting a word line and having for each word line a respective word line driver; wherein the control circuit is further adapted to control a time schedule for a pre-charge operation on a bit line.

Preferably, the DRAM memory device comprises a plurality of memory cell arrays each having a dedicated active-current generator controlled by the control circuit. It is often favorable to organize DRAM memory in so-called memory banks which are in principle independently accessible. This allows a flexible arrangement of power generators as to active-current generators and standby-current generators.

Preferably, the control circuit comprises a nonvolatile memory device for storing time data for the switching times and the schedule of the pre-charge operations for each bit line for ensuring the serviceability of the bit lines in the normal operation mode of the DRAM memory device. In particular, when very large memory arrays are concerned in a DRAM memory device, the optimum switching times and times for pre-charge operations after switching from an active-current generator to a standby-current generator can differ for each memory bank. This can occur because the delay time or running time of the corresponding signals is different due to different distances on the chip.

The DRAM memory preferably comprises for each bit line a complementary bit line. It is further an advantage, if the DRAM memory device comprises a programmable mode register for setting the operation mode of the DRAM memory device. The latter mode register may be easily accessible through the external control data and address input of the inventive DRAM memory device.

Further advantages, extensions and implementations of the invention are a subject of the detailed description of the invention and the appended claims in conjunction with the several use of the Figures.

DETAILED DESCRIPTION OF THE INVENTION

Figure 3:
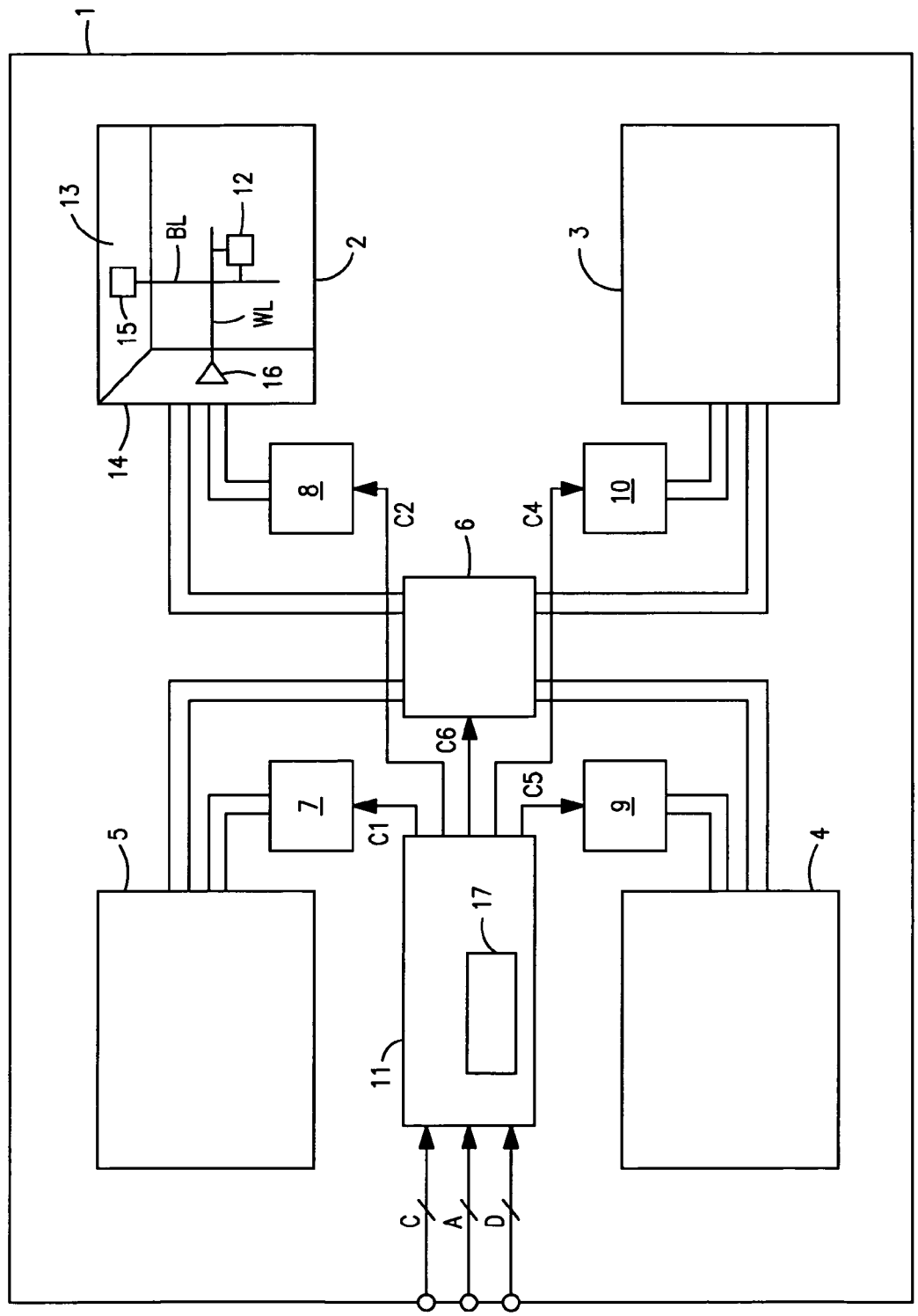
FIG. 3 shows a block diagram of an implementation of the inventive DRAM memory device.

FIG. 3 shows a schematic block diagram of an inventive DRAM memory chip 1.

The memory device comprises four memory banks or memory cell arrays 2, 3, 4, 5, a standby-current generator 6, four active-current generators 7, 8, 9, 10 each of which is associated with one of the memory cell arrays 2, 3, 4, 5 and a control circuit 11 for receiving external data address and control signals C, A, D and for control the active-current generators 7, 8, 9, 10 and a standby-current generator 6.

Each memory bank or memory cell array 2, 3, 4, 5 has a plurality of word lines and bit lines WL, BL of which only one is shown as an example one of in the memory banks 2. At each crossing point of the bit and word lines BL, WL, a memory cell 12 is situated. The memory cell arrays 2, 3, 4, 5 comprise column address decoders 13 and row address decoders 14, wherein the column address decoders 13 comprise sense amplifiers and pre-charge circuits 15 for reading and writing data from and into the connected memory cell 12, and an address decoder 14 comprises a word line driver 16 for each word line WL.

The control circuit 11 is connected to the standby-current generator 6 and the active-current generators 7, 8, 9, 10 for transmitting control signals C1, C2, C3, C4, C5, C6. Further, each active-current generator 7, 8, 9, 10 is connected to its associated memory bank 2, 3, 4, 5 for providing power to the respective sense amplifiers and pre-charge circuits 15. The central standby-current generator 6 is also connected to the memory banks 2, 3, 4, 5 for providing power to the respective sense amplifiers and pre-charge circuits 15. The control circuit 11 contains a nonvolatile memory device 17 for storing for example time schedule data and switching time data for the different memory banks 2, 3, 4, 5 and the respective bit lines BL. The DRAM memory device 1 may also comprise mode registers in which configuration codes are written for setting the operation mode of the device.

Figure 4A:
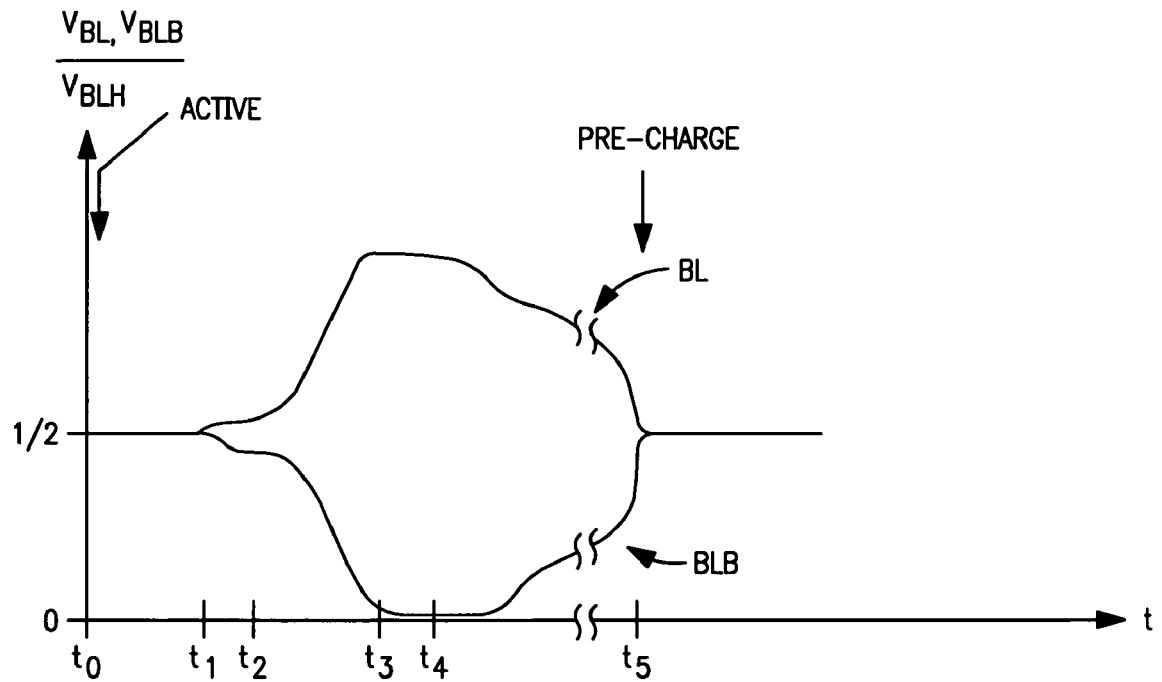
FIG. 4 shows alternative inventive time schemes for switching the power generators according to the inventive method for testing the serviceability of bit lines.

In the following, the inventive method for testing the serviceability of the bit lines, sense amplifiers and pre-charge circuits is described with reference to one exemplary memory bank 2, its dedicated active-current generator 8, the standby-current generator 6 and the control circuit 11 of FIG. 3 in conjunction with FIGS. 4A and 4B.

When initiating the test mode, control signals C are sent to the DRAM memory device 1 for setting the DRAM memory device 1 into a test mode. This may occur through writing configuration data into provided mode registers that may be accessible by coupling certain address and data signals to the data address and control inputs of the DRAM device 1.

Figure 1:
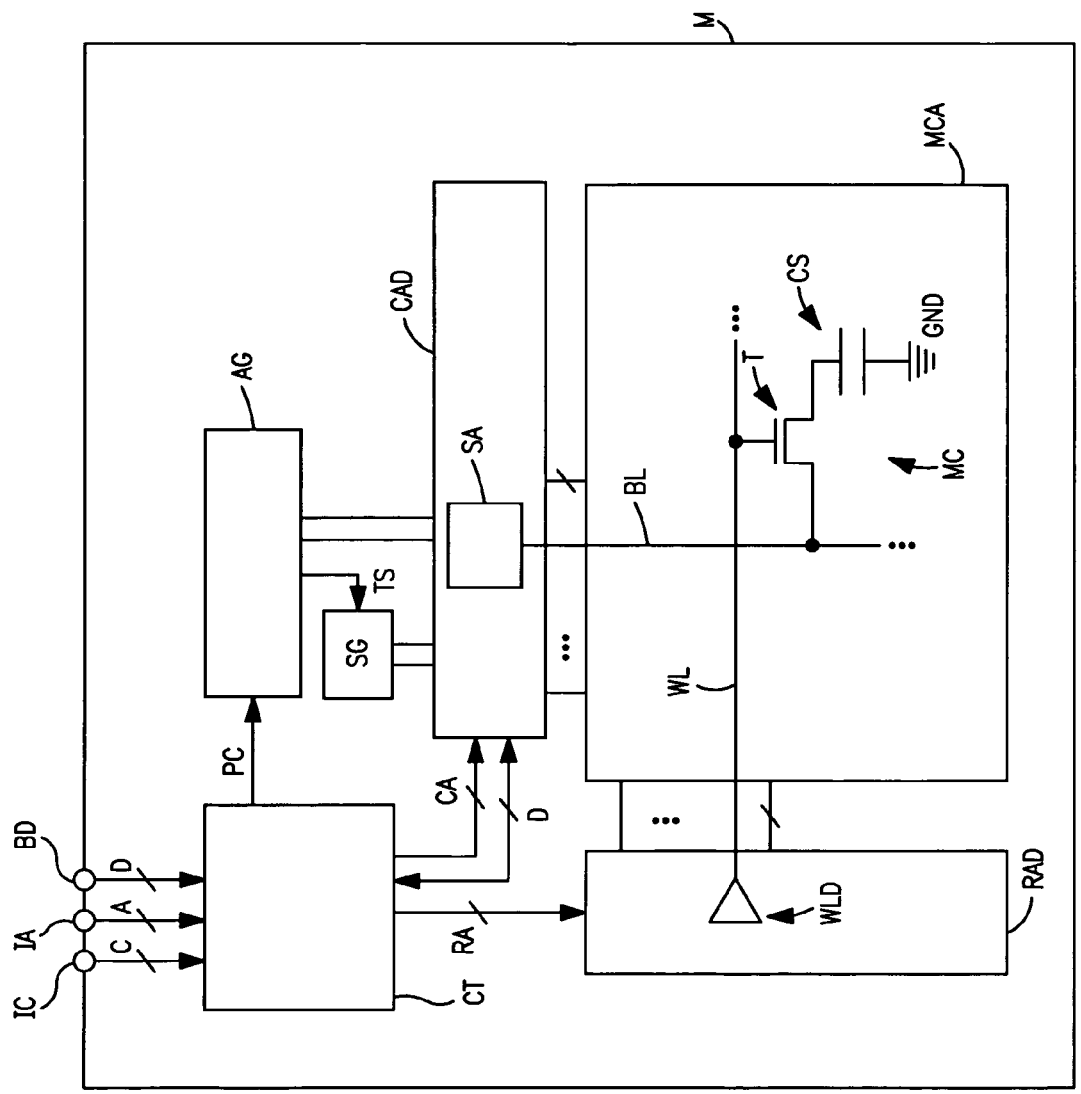
FIG. 1 shows a DRAM memory chip according to prior art.

Then, first, a write command is coupled to the DRAM memory device 1 for writing a predetermined test data to a memory cell 12 which is connected to a certain bit line BL and a certain write line WL. The test data for instance may be a logic one bit state. Contemporaneously, the dedicated active-current generator 8 is switched on for providing power to the respective sense amplifier and pre-charge circuit 15 which is associated to a bit line BL. Through the write command, a certain amount of charge is stored into the respective storage capacitor of the memory cell 12. This storage capacitor is also de-coupled from the bit line by making a respective select transistor isolating. The process of storing charge or bit information, respectively, in a memory cell is well-known from prior art and occurs analogously to the process depicted in FIG. 1.

Analog to a read process in a normal operation mode, now a respective select transistor is made conducting and thereby connects the respective storage capacitor of the memory cell 12 to the bit line.

Figure 2:
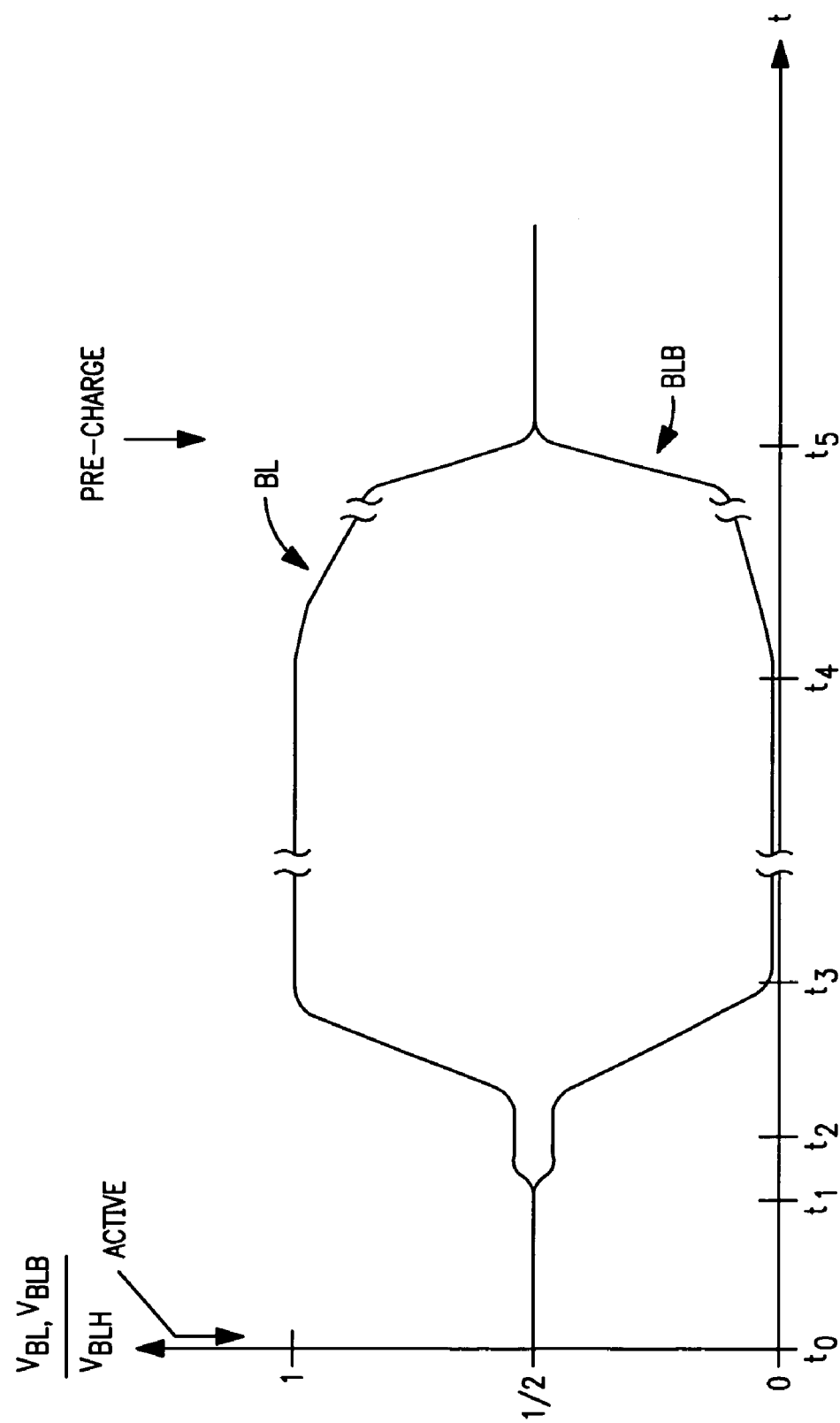
FIG. 2 shows the timing scheme and voltage characteristics of a read access to a bit line according to the prior art memory chip of FIG. 1.

Then, a charge distribution process takes place from time $t_1$ onthat increases the potential on the bit line BL due to the additional charge from a storage capacitor. Between the times $t_1$ and $t_2$, the distribution process of charge on the bit line is not yet enhanced by the respective sense amplifier 15 due to the response time after an active command. At a time $t_2$, the amplification of the respective sense amplifier in the amplifying and pre-charge circuit 15 sets in and increases the voltage potential on the bit line BL to the nominal logic bit line high level $V_{BLH}$. As in FIG. 2 both voltage characteristics $V_{BL}, V_{BLB}$ of the bit line BLB and the corresponding complementary bit line BLB are shown. In the following the term bit line is used synonymously for the system of bit line and complementary bit line, and the differential signal composed of $V_{BL}$ and $V_{BLB}$ is referred to. Usually, the respective signals are symmetric with respect to one half of the nominal high voltage $V_{BLH}$.

The control circuit 11 is adapted to flexibly set the switching time at which the active-current generator 8 is switched off. And the sense amplifier and pre-charge circuit 15 from time $t_4$ receive their power from the standby-current generator 6. The switching time $t_4$ is chosen earlier than the switching time in a normal operation mode of the DRAM memory device 1. In comparison to the standard test method the "idle" time between $t_2$ and $t_4$ is considerably reduced.

Since the standby-current generator 6 provides lower power than the former active active-current generator 8, the potential on the bit line BL decreases. Next, at a time $t_5$, a pre-charge operation on the bit line BL is performed by closing the associated word line WL, i. e. by de-coupling the memory cell 12 from the bit line by making the respective select transistor isolating. Then, a pre-charge voltage is applied to the bit line by the associated pre-charge circuit 15 which brings the potential on the respective bit line BL again to exactly one half of the level of the nominal bit line high voltage potential $V_{BLH}$.

The control circuit 11 then reads out in a normal read process the data stored in the memory cell 12. The charge stored in the memory cell 12 corresponds to the charge on the bit line at the time point $t_5$. This means, the charge in the memory cell 12 at the time $t_5$ usually does not correspond to a charge that is induced into the storage capacitor in a normal operation of the DRAM memory chip which is close to the nominal bit line high voltage potential $V_{BLH}$.

However, the charge in the storage capacitor may be sufficient to distinguish between logic states when a read operation is done. Therefore, in a next step, the data stored in the memory cell after the time $t_5$ is read. By comparing the read data with a predetermined test data which for instance was a logic one, serviceability of the bit lines, sense amplifiers and pre-charge circuits can be ascertained. If the read-out data corresponds to the predetermined test data written into, the memory cell associated to the bit line BL is deemed functioning. However, if the two data differ, an error in the bit line BL or the associated circuitry, hence, the sense amplifiers and pre-charge circuits 15 are not well functioning.

For setting the time schedule for switching from the active-current generator 8 to the standby-current generator 6 and performing the pre-charge operating and read-out, an inventive method for calibrating the time scales may be employed.

In the method for calibrating the time scales, the DRAM memory device is set into a test mode. Then, a predetermined test data is written into the memory cell which is connected to a known bit line, and contemporaneously an active-current generator for providing power to a sense amplifier and pre-charge circuit associated to the bit line is switched on. At a controllable switching time, the active-current generator 8 is switched off and a standby-current generator 6 is switched to the sense amplifier and the pre-charge circuit 15 of the corresponding bit line BL. The switching time is earlier with respect to the switching time in a normal operation mode.

Then, the voltage of the bit line BL is continuously measured and compared with a reference voltage. This reference voltage is usually the voltage at which logic states can still be distinguished. Hence, this reference voltage corresponds to a voltage on a bit line that is sufficient for creating enough charge in a storage capacitor which leads to a sufficiently high voltage on a bit line in a read operation for detecting the logic state reliably. Since the elapsed time is contemporaneously measured, the time at which the measured voltage on the bit line is equal to the reference voltage is a useful upper limit from a time $t_5$ in a test mode.

Figure 4B:
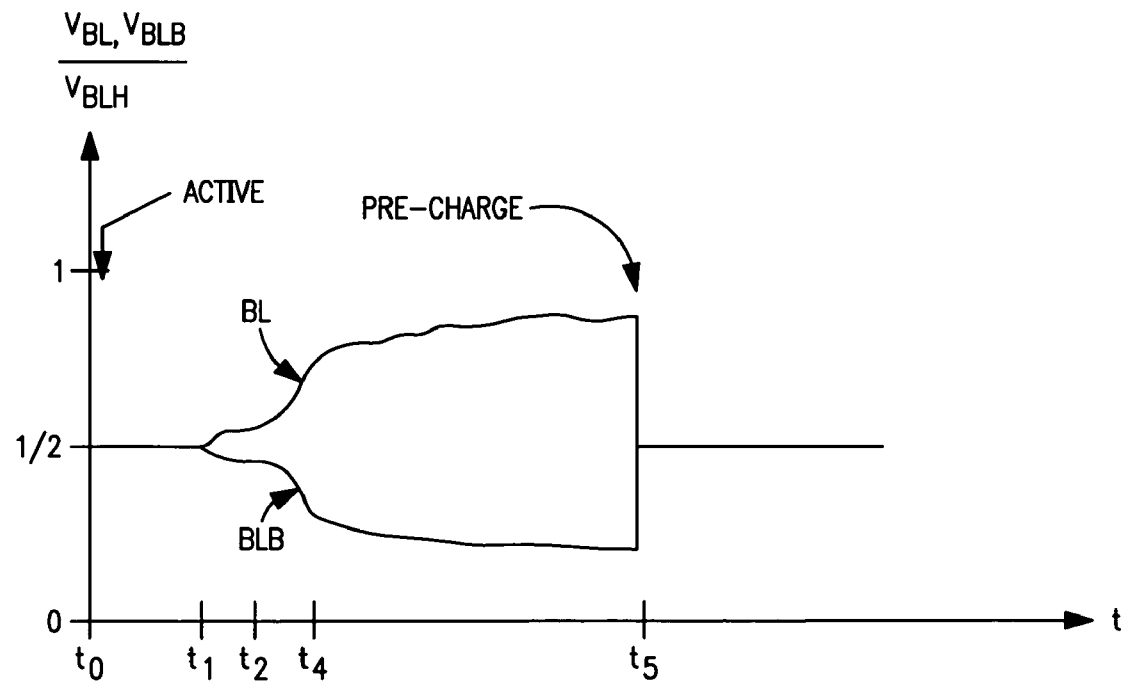

FIG. 4B shows a particular time schedule for the inventive method for testing the serviceability of bit lines, sense amplifiers and pre-charge circuits.

After setting the DRAM memory device in a test mode and writing the predetermined test data into a memory cell, the respective active-current generator 8 is switched on for providing power to the respective sense amplifiers and pre-charge circuits 15 associated to the bit line BL. However, according to FIG. 4B, the active-current generator 8 is already switched off at a time $t_4$ before the voltage on the bit line BL has reached a normal logic high voltage due to the amplification by the sense amplifier 15 i. e. the amplification is performed by the sense amplifier having the standby-current generator 6 as power supply. Also before reaching the nominal logic high voltage $V_{BLH}$ on the bit line BL, the pre-charge operation is performed and the data stored in the memory cell is read out. The selection of switching and pre-charge times as in FIG. 4B further reduces the overall testing tim. The time between $t_0$ and $t_5$ can be set to about 100 nanoseconds as compared to about 80 microseconds according to the prior art.

The main advantage of the inventive method for testing. the serviceability of bit lines, sense amplifiers and pre-charge circuits is that it is extremely time-efficient. Since the switching between active-current generators and standby-current generators can be flexibly set and in particular, the switching time $t_4$ can be set close to the time where the voltage from the bit line has reached a normal logic high voltage or even before this time, the method is extremely fast. This effect is further enhanced because the steps of the method for testing the serviceability usually must be performed for every bit line in a DRAM memory device. Therefore, the overall testing time is significantly decreased with respect to time schedules according to prior art.

Additional advantages and modifications will readily be apparent to those skilled in the art. Therefore, the invention in its broader aspect is not limited to the specific details and the illustrated examples shown and described herein. Accordingly, various modifications may be made without departing from the spirit or scope of the general inventive concept as defined by the appended claims and their equivalence. In particular other timing schemes as shown in the examples cam be chosen, and the inventive DRAM device will provide for various applications where power efficient operation in combination with nonstandard timing sets is desires.

REFERENCE LIST

M DRAM memory chip
IC Control input
IA Address input
BD Data in- and output

C Control signals
A Address signals
C Control signals
D Data signals
PC Power control signals
CT Control circuit
RA Row address signals
CA Column address signals
AT Active-current generator
SG Standby-current generator
TS Control signal
CAD Column address decoder
SA Sense amplifier and pre-charge circuit
WLD Word line driver
RAD Row address decoder
MCA Memory cell array
WL Word line
BL Bit line
T Select transistor
CS Storage capacitor
MC Memory cell
GND Ground
1 DRAM memory device
2, 3, 4, 5 Memory cell arrays
6 Standby-current generator
7, 8, 9, 10 Active-current generator
11 Control circuit
12 Memory cell
13 Column address decoder
14 Row address decoder
15 Sense amplifier and pre-charge circuit
16 Word line driver
17 Memory device

What is claimed:

1. A method for testing the serviceability of bit lines, sense amplifiers and pre-charge circuits in a DRAM memory device comprising the following steps:
   (a) setting a DRAM memory device in a test mode;
   (b) applying a write command to the DRAM memory device for writing a predetermined test data to a memory cell connected to a bit line and contemporaneously switching on an active-current generator for providing power to a sense amplifier and pre-charge circuit associated to the bit line;
   (c) switching off the active-current generator and switching a standby-current generator to the sense amplifier and the pre-charge circuit of the bit line at a controllable switching time, wherein the switching time is earlier with respect to a switching time in a normal operation mode;
   (d) performing a pre-charge operation on the bit line by closing a word line associated to the memory cell and applying a pre-charge voltage to the bit line by the associated pre-charge circuit;
   (e) reading the data stored in the memory cell; and
   (f) comparing the read data with the predetermined test data.

2. The method of claim 1, wherein, the steps (a)–(f) are performed for every bit line in the DRAM memory device.

3. The method of claim 1, wherein, the switching time for switching from the active-current generator to the standby-current generator is set to switch before a voltage at the bit line has reached a nominal logic high voltage due to amplification by the sense amplifier.

4. The method of claim 1, wherein, the switching time for switching from the active-current generator to the standby-current generator is set to switch after a voltage at the bit line has reached a nominal logic high voltage due to amplification by the sense amplifier.

5. The method of claim 1, further comprising a method for calibrating time scales for the testing, the calibrating method comprising the following steps:
   (a) setting a faultless DRAM memory device in a test mode;
   (b) applying a write command to the DRAM memory device for writing a predetermined test data to a memory cell connected to a bit line and contemporaneously switching on an active-current generator for providing power to a sense amplifier and pre-charge circuit associated to the bit line;
   (c) switching off the active-current generator and switching a standby-current generator to the sense amplifier and the pre-charge circuit of the bit line at a controllable switching time, wherein the switching time is earlier with respect to a switching time in a normal operation mode;
   (d) continuously measuring the voltage at the bit line and comparing the measured voltage with a reference voltage and contemporaneously measuring the lapsed time; and
   (e) storing the lapsed time if the measured voltage falls below the reference voltage for determining a minimum switching time.

6. A DRAM memory device comprising:
   (a) at least one array of memory cells, each memory cell being connected to a bit line and a word line, each of said bit lines being connected to a sense amplifier and a pre-charge circuit;
   (b) a controllable active-current generator for providing power to the sense amplifiers and pre-charge circuits for a time interval that is limited by a time at which a command for a read or write access is applied to the DRAM memory device and an assigned switching time;
   (c) a controllable standby-current generator for providing power to the sense amplifiers and pre-charge circuits after the switching time;
   (d) a control circuit for receiving external data, address and control signals and for controlling the active-current generator and the standby-current generator;
wherein the control circuit is adapted to control the time for switching the respective power generator to the sense amplifiers and to the pre-charge circuits subject to an external test mode signal for reducing the overall testing time in a test of the serviceability of the bit lines, sense amplifiers and pre-charge circuits.

7. The DRAM memory device of claim 6, wherein, the switching time is fixed in a normal operation mode of the DRAM memory device, and the control circuit is adapted to decrease the time interval in a test mode of the DRAM memory device.

8. The DRAM memory device of claim 6, wherein, it is provided:
   (a) a column address decoder connected to the sense amplifiers and pre-charge circuits for reading and writing data from and into the memory cells;
   (b) a row address decoder connected to the word lines for selecting a word line and having for each word line a respective word line driver; and wherein
   (c) the control circuit is further adapted to control a time schedule for a pre-charge operation on a bit line.

9. The DRAM memory device of claim 6, wherein, the DRAM memory device comprises:

(a) a plurality of memory cell arrays each having a dedicated active-current generator controlled by the control circuit.

10. The DRAM memory device of claim 6, wherein, the control circuit comprises a nonvolatile memory device for storing time data for the switching times and the schedule of the pre-charge operations for each bit line for ensuring the serviceability of the bit lines in the normal operation mode of the DRAM memory device.

11. The DRAM memory device of claim 6, wherein, for each bit line a complementary bit line is provided.

12. The DRAM memory device of claim 6, wherein, the DRAM memory device further comprises a programmable mode register for setting the operation mode of the DRAM memory device.

* * * * *